United States Patent [19]

Scherer et al.

[11] Patent Number: 5,008,631

[45] Date of Patent: Apr. 16, 1991

[54] PULSE ANALYZER WITH GAIN COMPRESSION

[75] Inventors: Dieter Scherer, Palo Alto; William E. Strasser, Montara, both of Calif.

[73] Assignee: Hewlett-Packard Company, Palo Alto, Calif.

[21] Appl. No.: 394,407

[22] Filed: Aug. 16, 1989

[51] Int. Cl.5 .............................................. H03F 3/68
[52] U.S. Cl. .................................. 330/51; 330/124 R; 330/151
[58] Field of Search ..................... 330/51, 124 R, 151, 330/295, 302, 306

[56] References Cited

U.S. PATENT DOCUMENTS

| | | | |
|---|---|---|---|
| 3,525,948 | 8/1970 | Sherer et al. | 330/51 |
| 4,091,414 | 5/1978 | Chow | 358/174 |
| 4,227,256 | 10/1980 | O'Keefe | 455/251 |
| 4,236,126 | 11/1980 | Weller et al. | 333/81 |
| 4,281,295 | 7/1981 | Nishimura et al. | 333/14 |
| 4,357,577 | 11/1982 | Smither | 330/51 |
| 4,365,193 | 12/1982 | Bollero et al. | 324/102 |
| 4,564,804 | 1/1986 | Wilke et al. | 324/103 |
| 4,598,252 | 7/1986 | Andricos | 330/51 |
| 4,646,036 | 2/1987 | Brown | 333/81 |
| 4,743,863 | 5/1988 | Chassany et al. | 330/284 |

FOREIGN PATENT DOCUMENTS

| | | | |
|---|---|---|---|
| 90612 | 7/1981 | Japan | 330/51 |
| 212013 | 10/1985 | Japan | 330/51 |

OTHER PUBLICATIONS

Salt et al., "Autoranging Amplifier with High Linearity", *Analytical Chemistry*, vol. 52, No. 13, Nov. 1980, pp. 2237,2238 330-351.

*Primary Examiner*—James B. Mullins

[57] ABSTRACT

Apparatus and method for extending the effective dynamic range of pulse measure and pulse display devices by providing dynamic gain switching, with an associated gain or attenuation coefficient that assumes one of a plurality of two or more values, depending on the instantaneous magnitude of the signal received or upon the choice of an external controller. The amplification path may be one of a plurality of mutually exclusive parallel paths. Alternatively, the amplification path may be a serial combination of an arbitrary subset of a collection of amplification paths. The choice of amplification path may be made automatically by a fast-acting sensor such as a signal comparator or may be made by an external control provided by a human operator or computer and may be overridden by an externally produced control override signal.

5 Claims, 5 Drawing Sheets

PULSE ANALYZER WITH GAIN COMPRESSION

DESCRIPTION

1. Technical Field

This invention relates to measurement of pulse signals and particularly to pulse analyzers with an extended dynamic range.

2. Background of the Invention

The process of observing and measuring electrical pulses often must contend with a problem of dynamic range limitation. Dynamic range in an amplifier is the difference or ratio between high and low level magnitude signals over which the amplifier is operational, the amplifier being limited at the upper end by the presence of non-linear response and being limited at the lower end by the level of noise present. For a finite size detection window, such as a limited analog-to-digital conversion range, an amplifier setting used for measuring the top of a high magnitude pulse signal may be insufficient to show pulse details near the bottom or lower magnitude portions of the signal. Or, alternatively, if the pulse details near the pulse bottom are adequately amplified, details near the top of the pulse may be distorted or otherwise limited.

In U.S. Pat. No. 4,091,414, Chow discloses separation of an electrical signal into a low frequency (LF) component and a high frequency (HF) component, with the amplitude of the LF component being limited relative to the amplitude of the HF component in order to preserve the finer detail contained in the HF component. The components are later added to produce a composite output signal.

O'Keefe, in U.S. Pat. No. 4,227,256, discloses use of a high gain amplifier circuit and a parallel low gain amplifier circuit. One gain circuit gradually turns off as the other gain circuit turns on, and conversely, off as the other gain circuit turns on, and conversely, driven by a conventional automatic gain control circuit. The apparatus utilizes two pnp transistors that are grounded at their collectors through separate diodes, with a common voltage bias applied to their emitters and with separate voltage biases, one of which is supplied by the AGC circuit, connected to the bases of the two transistors. No provision is made for dynamically specifying which gain path should be operative or for disabling or blocking one path completely when the other path is active.

In U.S. Pat. No. 4,281,295, Nishimura et al. disclose use of a non-linear expander/compressor device to logarithmically scale the magnitude of an incoming electrical signal according to which of several frequency regions the incoming signal belongs. The outputs are later added to produce a composite output signal.

In U.S. Pat. No. 4,365,193 Bollero et al. teach measurement of overvoltage pulses on a transmission line. The apparatus comprises a voltage divider working into a first and a second comparator respectively detecting an abnormal voltage exceeding a predetermined sensitivity threshold and discriminating among different amplitude levels above that threshold. The first comparator triggers an oscillator driving a pulse counter which measures the duration of an overvoltage pulse and also provides quantized information on rise time to the highest amplitude threshold surpassed by that pulse as determined by the second comparator. This information is stored in a memory with two groups of cells respectively assigned to combinations of amplitude with duration and combinations of amplitude with rise time, the occurrence of any such combination incrementing the contents of the respective cell. These cells are cyclically scannable and their contents can be selectively displayed.

Apparatus for automatically measuring peak voltage values is disclosed by Wilke et al. in U.S. Pat. No. 4,564,804. The apparatus uses a comparator to convert an incoming signal to a digital signal bit-by-bit, beginning with the most significant bit for the voltage range covered. Control of gain or attenuation coefficient for an incoming signal is not discussed.

Cassany et al., in U.S. Pat. No. 4,743,863, disclose use of a switchable signal attenuator to increase the dynamic range of an amplifier circuit. A comparator compares an incoming voltage signal with a preset voltage threshold. When this threshold is exceeded, the incoming signal is routed through an attenuator before the incoming signal is passed through a logarithmic amplifier. The increment of output voltage that is instantaneously removed at the time point where attenuation is first switched in is added back by another circuit to form a new output signal that does not manifest this discontinuity.

Formation of the logarithm of the magnitude of a signal is often used to obtain gain compression. However, this approach does not preserve linear resolution, and the bandwidth is often not adequate to handle the full range of the magnitude.

What is needed is an approach that extends the dynamic range of pulse measuring devices so that details of both low voltage magnitude and of high voltage magnitude are displayed accurately and conveniently.

SUMMARY OF THE INVENTION

These needs are met by an instrument that measures high and low level pulse behavior, by dynamic gain switching. As used herein, the phrase "dynamic gain switching" refers to a method of changing the gain of an amplifier "on the fly" or instantaneously in response to change with time of the signal magnitude. This phrase should not be confused with the phrase "dynamic range", which is defined above and refers to a ratio of high and low magnitude signals rather than to characteristics associated with a rapidly time-varying signal. The instrument is switched automatically between two or more amplifier gain configurations in order to amplify and display voltage pulse details in high and low ranges of voltage magnitudes. Alternatively, the choice of amplifier gain configuration may also be made by an externally introduced signal that is controlled by the operator. In the automatic switching situation, the choice of amplifier gain configuration is made by a signal comparator or similar device that analyzes the instantaneous magnitude of the voltage pulses received and rapidly chooses and implements the appropriate amplifier gain configuration for the instantaneous signal.

The instrument includes first and second amplifiers, each having a different gain or attenuation coefficient, e.g. A1 and A2, where A1 is much larger than A2. The apparatus also includes a pair of signal switches that switch an incoming voltage input signal between the first amplifier and the second amplifier, depending on the value of a control signal received at the pair of switches. The control signal received by the pair of switches may be externally produced, for example, by the operator of the apparatus. The control signal may also be produced internally and automatically by a fast reaction comparator or other device that analyzes the instantaneous magnitude of the incoming signal and determines the appropriate gain or attenuation factor for the signal. The switches themselves may be gallium arsenide switches with associated reaction times of the order of one nsec.

This apparatus allows use of a detector or other signal processing device with limited dynamic range, such as 48 dB, to linearly measure and display a signal with much wider dynamic range, such as 100 dB. Details of the signal for small voltage magnitudes and for high peak voltages may thus be analyzed and displayed, with similar resolution for display. The degree of resolution of signal details is controlled by the choice of the number of gain or attenuation ranges used for the signal processing and display.

BEST MODE FOR CARRYING OUT THE INVENTION

Figure 1:
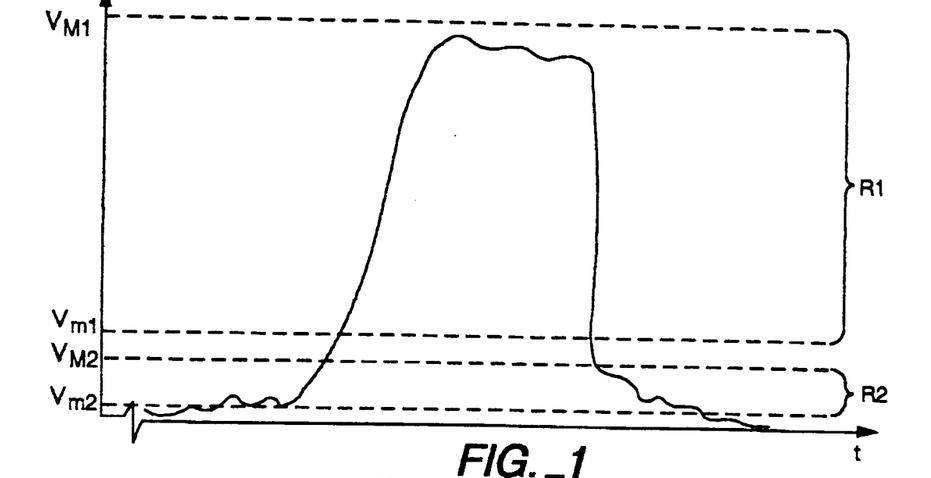
FIG. 1 is a graphic view of the variation of a voltage pulse with time, showing two different voltage magnitude ranges of interest for amplification purposes.

With reference to FIG. 1, a time varying voltage pulse shown therein is assumed to be received by signal processing apparatus for measurement and display. In the measurement and display of electrical pulses, a pulse having a large dynamic range can present serious problems as regards amplification or other processing of the signal or display of the signal received. If the dynamic range of a time varying signal V is represented by the ratio $V_{max}/V_{min}$, a dynamic range of more than 100 is likely to present problems. In FIG. 1, the signal pulse displayed has an upper pulse portion that is conveniently amplified by an amplifier that works best for voltage magnitudes V satisfying $V_{m1} < V < V_{M1}$ (range R1). However, for adequate amplification of details of the signal pulse near the lower pulse portion, signal magnitudes in the range $V_{m2} < V < V_{M2}$ (range R2) may need to be observed or measured. Little or no overlap is available between the two useful ranges of signal magnitude. If signal amplification is optimal for signal magnitudes in the first range R1, $V_{m1} < V < V_{M1}$, amplification of pulses of much smaller magnitude will likely be insufficient. The inverse problem, too much gain and the concomitant limiting effects, occurs if amplification is optimized for signals in range R2 and is applied to a signal in the range R1.

Figures 2, 3:
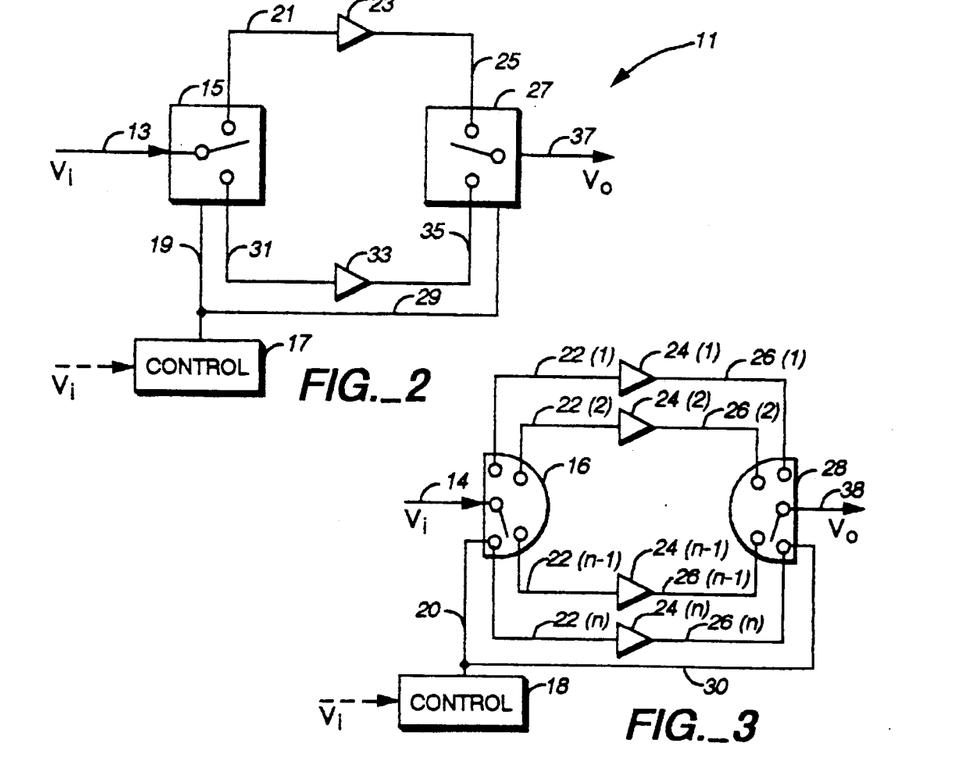
FIG. 2 is a plan view of one embodiment of the invention that incorporates two mutually exclusive amplifier configurations for an incoming signal pulse.
FIG. 3 is a plan view of another embodiment of the invention that incorporates N mutually exclusive amplifier configurations for an incoming signal pulse.

FIG. 2 illustrates an embodiment 11 of the invention that permits a variable choice of the optimal amplifier gain coefficient $A(=A_1 \text{ or } A_2)$ for each of two ranges of signal magnitude, for signal amplification purposes. For definiteness, it is assumed here that A is positive and that the electrical signal received is voltage. However, the invention applies as well to a negative gain coefficient and to a signal that represents current or power rather than voltage. An incoming signal $v_i$ is received on a signal input line 13 by a first switch 15 that also receives a control signal C produced and issued by a control signal source 17 on a first control line 19. If the control signal has a first value C1, the switch 15 connects the input line 13 to a first signal line 21 that is received by a first amplifier 23 that is optimized for signals having relatively high magnitude, such as voltages in the range R1 shown in FIG. 1. The incoming signal received on the line 13 is amplified by the high range amplifier 23. The amplified signal is then passed by a second signal line 25 to a second switch 27 that also receives the control signal from the control signal source 17, on a second control line 29. If the control signal received by the second switch 27 has the first value C1, the output of the second switch is connected to the signal line 25.

If the control signal source 17 produces and issues on the control line 19 a control signal having a second value C2, the signal input line 13 is connected to a third signal line 31 that feeds a second amplifier 33 whose amplification is optimized for a low magnitude signal, such as signals in range R2 shown in FIG. 1. The amplified signal produced by the amplifier 33 is then passed by a fourth signal line 35 to the second switch 27. If the second switch receives a control signal on the control line 29 that has the second value C2, the output terminal of the second switch 27 is connected to the signal line 35. The result of this is that, depending on whether the control signal source 17 produces a control signal C1 or C2, the voltage input signal received by the first switch 15 will be amplified by the high magnitude amplifier 23 or by the low magnitude amplifier 33, respectively, and will be issued at the output terminal of the second switch 27. The amplifier 23 may be chosen to have a smaller gain coefficient than the amplifier 33, if the dynamic range of the output signal $v_o$ is to be reduced. The choice of signal magnitude range for which the corresponding amplifier is optimized may be extended from two such amplifiers to N such amplifiers, each with its own optimal range of voltage amplification, each with its own optimized design for low noise and low distortion, and with each amplifier corresponding to a different control signal value produced by the control signal source 17.

Because the second amplification path with associated gain coefficient $A_2$ receives lower magnitude input voltages than does the first amplification path with gain coefficient $A_1$, it is required that $A_2 > A_1$. More particularly, at least one of the two gain coefficients $A_1$ and $A_2$ may satisfy $O < A \leq 1$ so that the associated amplification path produces signal attenuation. The situation $A = 1$ corresponds to no gain and no attenuation.

The control signal source 17 may produce control signals in response to a choice by an external controller of the apparatus. Alternatively, the control signal source may include a fast comparator that receives the incoming signal, quickly and automatically determines the instantaneous range of the signal magnitude and chooses a control signal that best optimizes the voltage amplification for that magnitude range. Preferably, the fast comparator could have a reaction time of no more than 3 nsec, to produce the control signal.

The two signal amplification paths in FIG. 2 containing the respective amplifiers 23 and 33 may be replaced by a plurality of $N \geq 2$ amplification paths, as shown in FIG. 3, each containing an amplifier with an associated gain coefficient $A_i$ ($i = 1, 2, \ldots, N$), with some or all of the coefficients $A_i$ differing from one another. In this instance, the first switch 15 in FIG. 2 is replaced by a first switch 16 that receives an incoming signal $v_i$ on input line 14 and receives a control signal C having N different analog or digital values $C_1, C_2, \ldots, C_N$ on a control line 20 from a control signal source 18. If the switch 16 receives control signal $C_i$, the first switch connects its output terminal to amplification path no. i, which comprises a first signal line 22(i) connected to the input terminal of an amplifier 24(i), with the amplifier output terminal being connected to a second signal line 26(i). The amplifier 24(i) will have gain or attenuation coefficient $A_i$. The control signal produced by the source 18 is also received by a second switch 28 on a second control line 30. If the second switch 28 receives control signal $C_i$, this switch connects an output line 38 to amplification path no. i. The result is that the incoming signal received on the input line 14 is multiplied by the gain coefficient $A_i$ and is issued as output signal $v_o$ on the output line 38. The control signal source 18 that produces the N-valued control signal C may include a fast comparator that examines the instantaneous magnitude of the incoming signal, determines which gain coefficient $A_j$ is optimal for this particular portion of the incoming signal, and issues the control signal $C_j$ for that portion of the signal.

Figure 4:
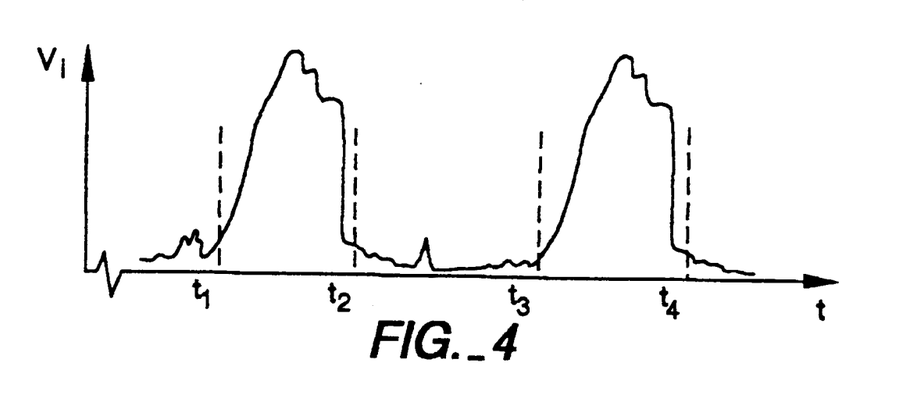
FIG. 4 is a graphic view of an incoming signal received by the apparatus of FIG. 2.
Figure 5:
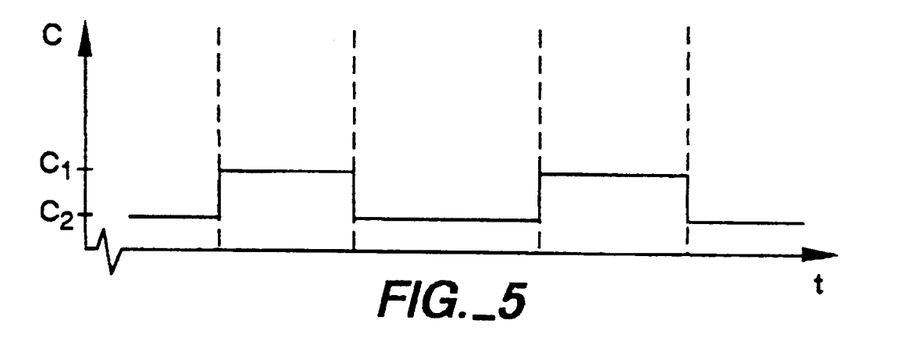
FIG. 5 is a graphic view of the variation with time of the control signal in FIG. 2, where the control signal varies between two values depending upon the magnitude of the instantaneous incoming signal.
Figure 6:
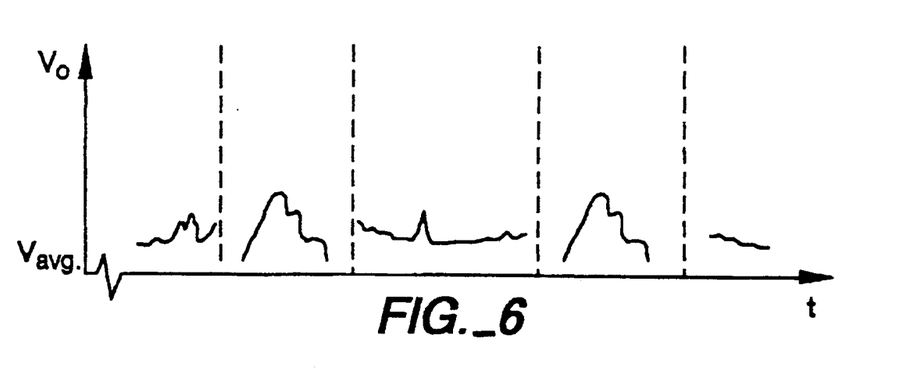
FIG. 6 is a graphic view of the output of the output signal produced by the apparatus of FIG. 2, illustrating the reduction in dynamic range produced by dynamic gain switching, using the control signal shown in FIG. 5.

FIGS. 4, 5 and 6 together illustrate the effect of use of dynamic gain switching or strobing of the amplifier apparatus in FIG. 2, applied to a sequence of incoming signal pulses as shown in FIG. 4. The control signal, shown in FIG. 5, produced by the control signal source 17 in FIG. 2 would have the value C2 as long as the signal magnitude is less than some predetermined threshold voltage, for example for the ranges $t < t_1$, $t_2 < t < t_3$ and $t_4 < t$. The control signal source 17 would produce the control signal C1 for the ranges $t_1 < t < t_2$ and $t_3 < t < t_4$, where the magnitude of the incoming voltage is higher than the predetermined threshold. The results of these choices, illustrated in FIG. 6, are that the output signal has a magnitude whose dynamic range is reduced, as shown, by use of a relatively small gain amplifier for the high magnitude portions (control signal C1), and the use of a higher gain amplifier for the incoming voltage where the voltage magnitude is considerably lower.

Figures 7, 8, 9:
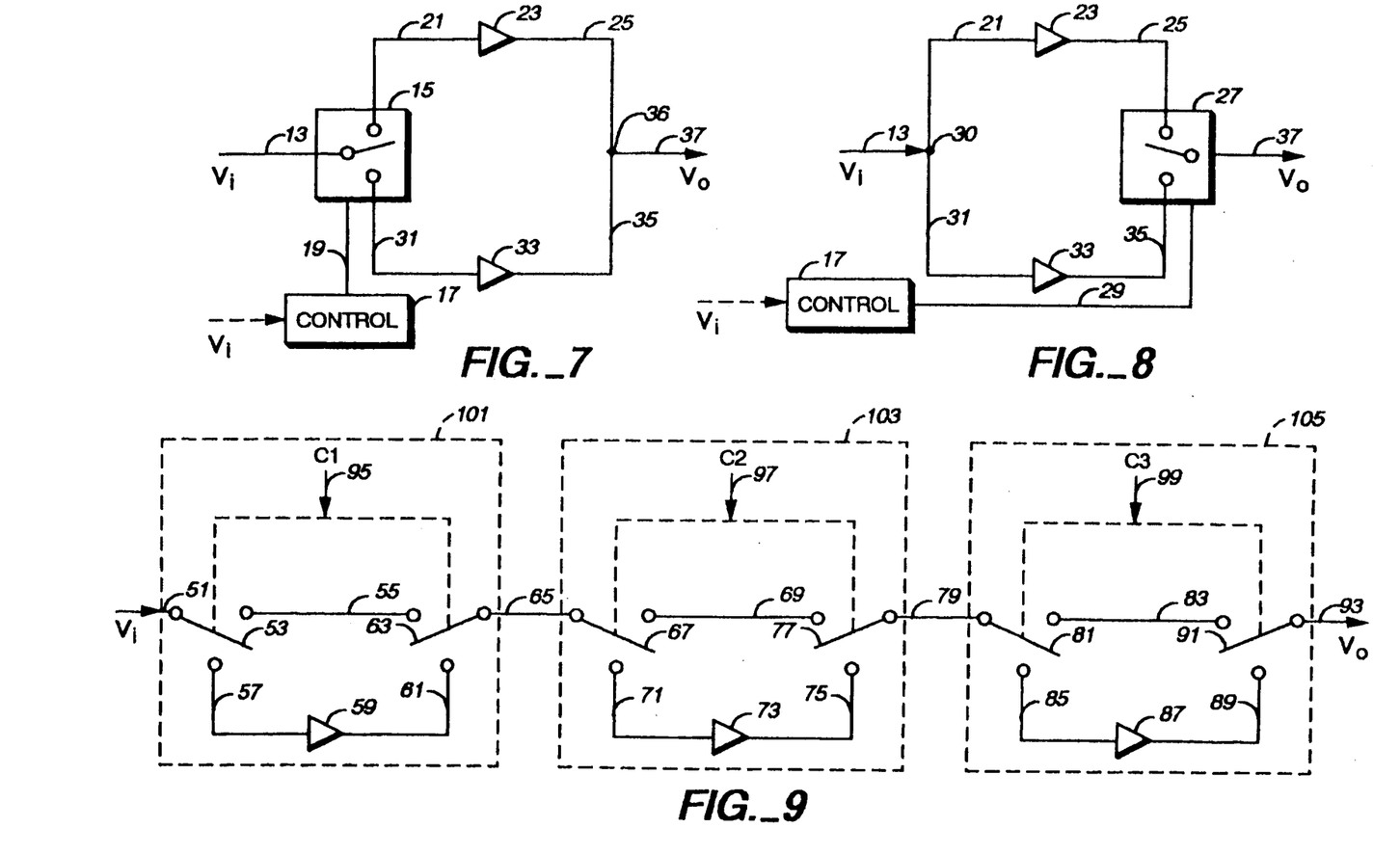
FIGS. 7 and 8 are plan views of modifications of the embodiment shown in FIG. 2.
FIG. 9 is a plan view of a second embodiment of the invention that incorporates two or more concatenated, independent parallel amplification circuits.

In FIG. 2 the second switch 27 can be replaced by a simple signal combiner such as an OR arrangement or a power combiner 36, as in FIG. 7, in which one or both of the signal lines 25 and 35 are tied permanently to the output line 37 that carries the signal $v_o$. If, for example, the first switch 15 makes a connection between the input line and the signal line 21, the signal line 31 will carry no current and the voltage on the signal line 35 will float at the voltage of the signal line 25. Effectively, then, the signal lines 31 and 35 and the associated amplifier 33 are not present in this configuration. In a similar manner, if the first switch 15 makes a connection between the input line and the signal line 31, the signal lines 21 and 25 and associated amplifier 23 are not present. However, sources of noise or small bias voltages may appear on one or both of the floating lines 21 and 25, or one or both of the floating lines 31 and 35, and thus produce a small but non-zero signals thereon that would add to the signal produced by the nonfloating amplification path in FIG. 7 on the output line 37. This is undesirable. For this reason, although the single switch configuration shown in FIG. 7 will function more or less as does the configuration shown in FIG. 2, the FIG. 2 configuration that uses two switches provides additional electrical isolation and well defined impedances and is thus preferred.

In a similar manner, the single switch configuration shown in FIG. 8, in which one or both of the signal lines 21 and 31 are permanently tied to the input line 13 in an OR arrangement or are combined through a power combiner 30, may replace the two switch configuration of FIG. 2.

FIG. 9 illustrates another embodiment of the invention for gain strobing or gain blanking of signals. An input signal arrives on an input line 51 at a first switch 53 that is part of a first bypass-amplification circuit 101. The first switch 53 connects to a first signal line 55 or to a second signal line 57, according to a first switch control signal C1 received on a first control signal line 95 from a control signal source. If the first switch 53 connects to the first signal line 55, bypass occurs and no amplification occurs at that stage. If the first switch 53 connects to the second signal line 57, the input signal $v_i$ passes through a first amplifier 59, is amplified (or attenuated), and the resulting signal is received by a third signal line 61 connected to the output terminal of the amplifier 59. A second switch 63, which is also controlled by the first switch control signal C1 received on the signal line 95, connects a signal line 65 to either the first signal line 55 or to the third signal line 61, according as the input signal $v_i$ is directed to the first signal line 55 or to the second signal line 57 by the first switch 53.

In a similar manner, the signal carried by the signal line 65 is directed to a second bypass-amplification circuit 103 that includes a third switch 67 and a fourth switch 77, operated together. The switch 67 directs the incoming signal to a signal line 75, or to a bypass signal line 69, according to a second control signal C2 received on a second control signal line 97 from a control signal source. The switch 77 works in tandem with the switch 67. The resulting signal is passed to a signal line 79.

In a similar manner, the signal carried by the signal line 79 is directed to a third bypass-amplification circuit 105 that includes a fifth switch 81 and a sixth switch 91, operated together. The switch 81 directs the incoming signal to a signal line 85, then to a third amplifier 87 and then to a signal line 89, or to a bypass signal line 83, according to a third control signal C3 received on a third control signal line 99 from a control signal source. The switch 91 works in tandem with the switch 81. The resulting signal is passed to a signal line 93 that carries the output signal $v_o$.

Both the second and third amplifier devices 73 and 87 may be signal amplifiers with gain or attenuation, or one or more of these two devices may be a frequency-selective or amplitude-selective device such as a low pass or high pass or bank pass filter, an amplitude limiter, or a slew rate limiter, for signal modification. Use of a low pass filter in place of one of the amplifiers 59, 73 or 87 is the most attractive, in order to severely attenuate any high frequency noise that arrives as part of the incoming signal. Herein, the term "filtered signal" will refer to a signal that has been passed through a frequency filter, an amplitude limiter or a slew rate limiter.

The embodiment shown in FIG. 9 may be reduced to a one bypass-amplification circuit such as 101 or to a series combination of two bypass-amplification circuits such as 101 and 103. The principle of operation of each bypass-amplification circuit such as 101 is similar to that of the others. Larger combinations of bypass-amplification circuits may be made by series concatenation of a plurality of these bypass-amplification circuits, as suggested in FIG. 9.

Figure 10:
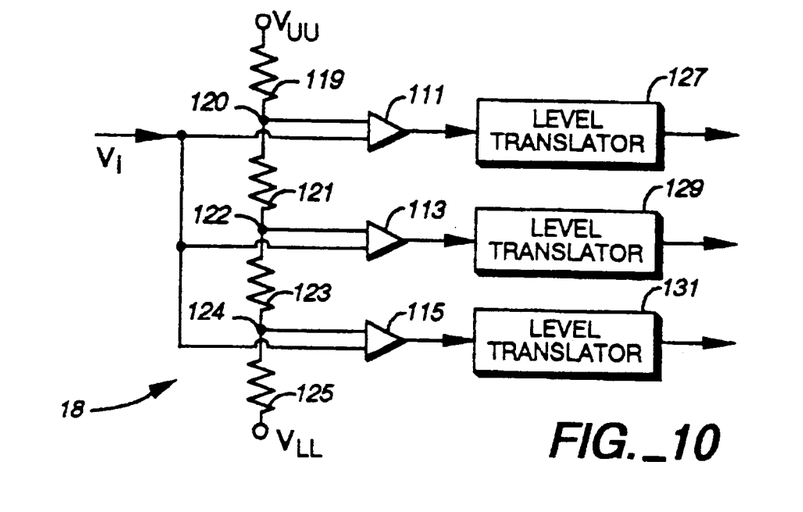
FIG. 10 is a plan view of a device to provide control signals to determine the path to be followed by an incoming signal in FIGS. 2, 3, 7, 8 or 9.

FIG. 10 illustrates one means of providing the control signals used in the embodiments shown in FIGS. 3 and 9. An input signal $v_i$ is received at the negative (or positive) input terminal of each of a plurality of two-input differential amplifiers 111, 113 and 115. This signal may vary with time. A voltage ladder 117 is provided by a plurality of resistors 119, 121, 123 and 125 connected in series between an upper voltage source that provides an upper voltage $V_{UU}$, and a lower voltage source that provides a lower voltage $V_{LL}$, with $V_{UU} > V_{LL}$. A first node 120 in the voltage ladder, positioned between the adjacent resistors 119 and 121, is connected to the positive input terminal of the amplifier 111. The voltage $v_{120}$ at the node 120 is determined by the relative resistance values of the resistors 119, 121, 123 and 125 and by the voltages $V_{UU}$ and $V_{LL}$, in a well known manner.

If the magnitude of the amplifier gain coefficient A is sufficiently high the amplifier output signal $v_{111}$ will usually have the "rail" value $\pm v_R$. If $v_{111} = +v_R$ ($v_{111} = -v_R$), this indicates that the input signal $v_i$ is less than $v_{120}$ (greater than $v_{120}$). The output signal $v_{111}$ will be negative only if the circuit input signal $v_i$ is greater than $v_{120}$.

In a similar manner, the output signal $v_{113}$ from the amplifier 113 will be negative only if the circuit input signal $v_i$ is greater than the voltage $v_{122}$ at a node 122 of the voltage ladder 117 that is connected to the positive input terminal of the amplifier 113. The output signal $v_{115}$ from the amplifier 115 will be negative only if the circuit input signal $v_i$ is greater than the voltage $v_{124}$ at a node 124 of the voltage ladder 117 that is connected to the positive input terminal of the amplifier 115.

The node voltages $v_{120}$, $v_{122}$ and $v_{124}$, together with the voltage $V_{uu}$, define three incoming voltage ranges, namely $v_{120} < v < V_{uu}$ (range $R_1$),
$v_{122} < v < V_{120}$ (range $R_2$),
$v_{124} < v < V_{122}$ (range $R_3$), within which one or more of the amplifiers 59, 73 and 87 in FIG. 9 would be bypassed. The incoming signal ranges should, preferably, have at most 0, 1 or 2 endpoints in common with each other.

The sequence of output signals from the plurality of amplifiers 111, 113 and 115 will consist of a consecutive string (possibly empty) of voltage values $-v_R$ followed by a consecutive string (possibly empty) of voltage values $-v_R$, and the sum of the lengths of these two strings will equal the number of amplifiers used (three in FIG. 10, but any number greater than or equal to one may be used). Each output signal from one of these amplifiers prescribes a choice of control signal C (if $v_{out} = +v_R$) and a choice of control signal C' (if $v_{out} = -v_R$). In FIG. 3, the sum of the number of control signals C (or C') that are issued by the differential amplifiers in FIG. 10 will determine the signal amplifier path and amplifier 24(1), 24(2), . . . , 24(N) that the incoming signal $v_i$ will pass through. In FIG. 9, for example, receipt of a sequence of control signals such as C1=C', C2=C', C3=C from the respective amplifiers 111, 113 and 115 (FIG. 10) on the switch control line 95, 97 and 99, respectively, may cause a choice of the signal processing paths 55 (as opposed to 57), 69 (as opposed to 71) and 85 (as opposed to 83), respectively. In this example, the input signal $v_i$ is passed through the amplifier 87 (C3=C) but not through the amplifiers 59 (C1=C') and 73 (C2=C'). Level translators 127, 129 and 131 can be optionally included in FIG. 10 to receive the output signals from the respective amplifiers 111, 113 and 115 and to translate the amplifier output voltages $v_{out} = \pm v_R$ to two distinct voltage levels that the remainder of the system can recognize.

Figure 11:
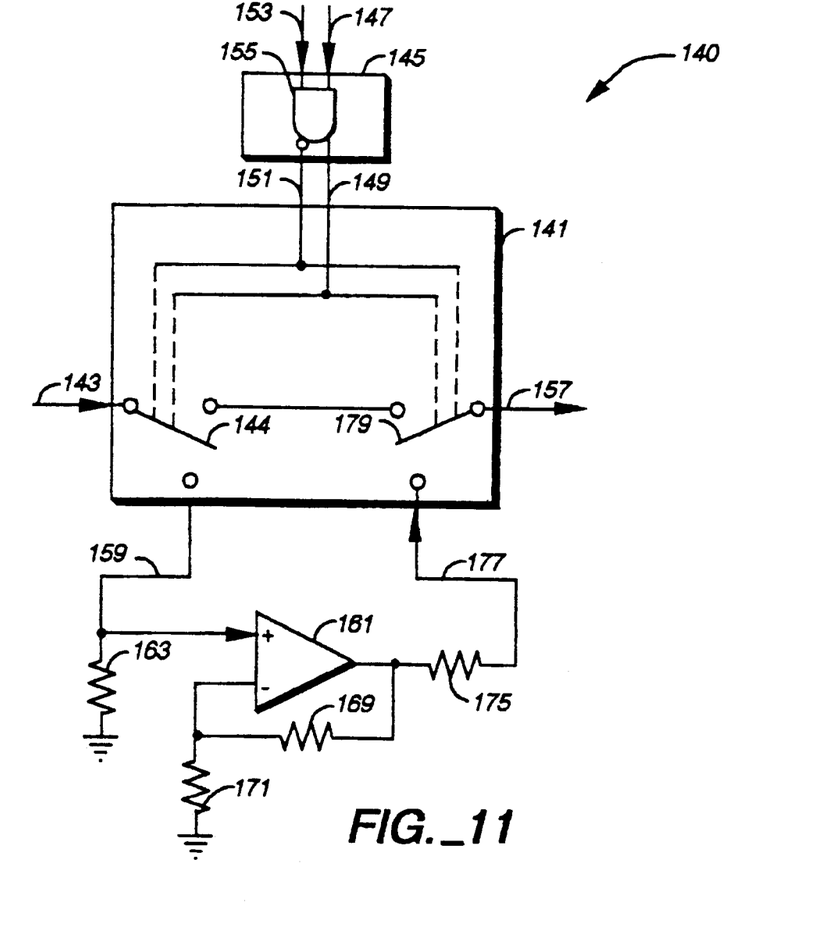
FIG. 11 is a plan view illustrating one stage of an amplifier and switch combination suitable for use in FIG. 9.
Figure 12:
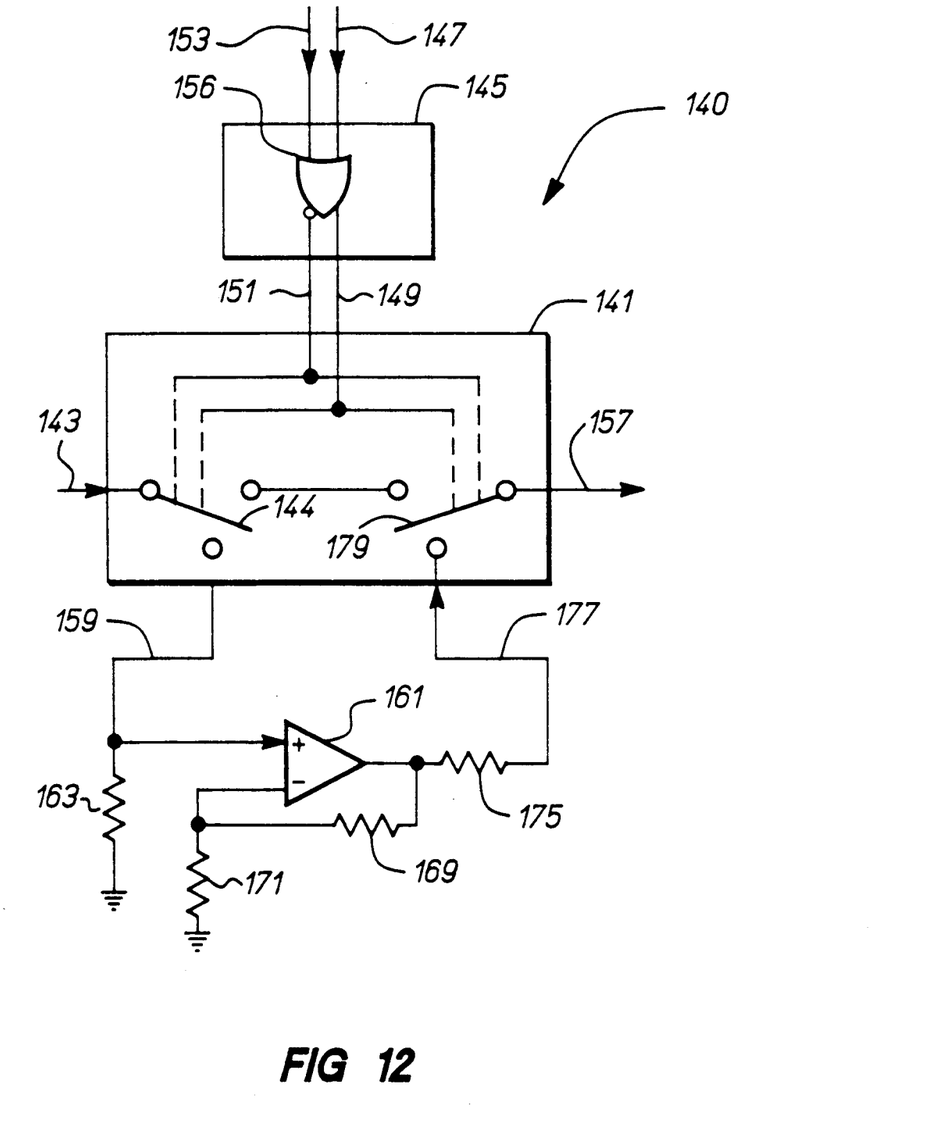
FIG. 12 is a plan view of a second embodiment illustrating one stage of an amplifier and switch combination suitable for use in FIG. 9.

FIG. 11 illustrates one embodiment 140 of a switch that is used to control the path a signal will follow in a gain switching or strobing arrangement such as in FIG. 9. A switch device 141 receives a signal $v_i$ to be amplified (or not amplified) on an input line 143 at a first terminal of a first switch 144. The material for the switch 144 may be GaAs or any other material with a small reaction time. A switch control unit 145 receives a control signal on a first control input line 147 that, in the absence of an override signal, determines the relative polarity of two logically complementary switch control signals C and C* (high or low) that appear on two switch control output lines 149 and 151. The two signals C and C* determine whether the input signal $v_i$ will be amplified (if line 147 receives signal C) or will be passed through a bypass line 147 without amplification (if line 147 receives signal C*). A second control input line 153 for the switch control unit 145 carries an externally controlled override signal that sets all switches, such as 144, substantially simultaneously so that the incoming signals all bypass the amplifiers. The switch control unit 145 may include a two-input logical AND gate 155 that receives the two input lines 147 and 153 and produces the logical product thereof. In this embodiment, the control signal C* and the active override signal received on the line 153 are both low. In an alternative embodiment, shown in FIG. 12, the logical AND gate 155 in FIG. 11 is replaced by a two-input logical OR gate 156, and the control signal C* and the active override signal are both high. The output signal from the device 141, representing an amplified or a non-amplified signal according to choice at this stage, appears on an output line 157. If the incoming signal is to be amplified, a signal line 159 carries the signal $v_i$ to the positive input terminal of a differential amplifier 161. The signal line 159 is grounded through a resistor 163. The amplifier 161 is provided with feedback from its output terminal to its negative input terminal through a resistor 169. The negative input terminal of the amplifier 161 is also grounded through a resistor 171. The signal appearing at the output terminal of the amplifier 161 is also passed through a resistor 175 to an amplifier output line 177 that is fed back to a terminal of a second switch 179 of the switch device 141, for issuance of the amplified signal on the output line 157 of this stage. If the amplifier 161 is to be bypassed, the incoming signal $v_i$ will be routed directly to the output line 157 along the bypass line 142 by the two switch terminals 144 and 179 working together. Single stages of the device 140 shown in FIG. 11 can be concatenated so that the output line 157 of one stage becomes the input line 143 of the next stage, as suggested in FIG. 9 where three such stages 101, 103 and The control signals C and C* delivered on the signal lines 151 and 153 may be generated and issued by a DMOS switch control device 145 such as the DG390X. In a preferred embodiment, the GaAs switch device 141 is the ANZAC GaAs SPDT switch device chip, Model SW-200. If the GaAs switch 141 includes means to invert a control signal received, one of the two control signal input lines 149 and 151 may be deleted, with the logical complement of the one control signal received being generated internally by the GaAs switch.

In a preferred embodiment, the resistors 163, 169, 171 and 175 have the resistance values 51, 968, 51 and 51 Ohms, respectively.

We claim:

1. A method for reducing the dynamic range of an incoming electrical signal, the method comprising the steps of:

determining the magnitude of the incoming signal;

providing a control signal that has a first value if the incoming signal magnitude exceeds a predetermined value, and that has a second value if the incoming signal magnitude does not exceed a predetermined value;

providing a control override signal, having an active state and an inactive state, that, in its active state, overrides the control signal and sets the control signal value equal to the first value; and passing the incoming electrical signal through an amplifier circuit that receives the control signal and control override signal, to multiply the incoming signal by a first amplification coefficient $A_1$ and to issue this amplified signal as an output signal if the control signal value received has the first value, and to multiply the incoming signal by a second amplification coefficient $A_2$ and to issue this amplified signal as an output signal if the control signal value received has the second value, where the magnitudes of the amplification coefficients satisfy $0 < A_1 < A_2$, whereby the dynamic range of the collection of the first and second output signals is less than the dynamic range of the incoming signal.

2. Apparatus for gain switching to expand the usable dynamic range of an electronic device that receives and processes an incoming signal, the apparatus comprising:

amplification means, having an input terminal and an output terminal, for receiving an input signal at its input terminal and for producing and issuing at its output terminal an output signal that is approximately equal to the input signal multiplied by a selected gain coefficient;

a first signal line to deliver an incoming signal thereon, and a second signal line to receive and propagate an outgoing signal thereon;

a third signal line having a first end to receive an input signal and to allow the signal to propagate to a second end thereof;

signal switch means having first and second control input terminals to receive first and second control signals thereat and having first, second, third, and fourth signal terminals, with the first signal terminal being connected to the first signal line to receive an incoming signal thereon, and with the second signal terminal being connected to the second signal line, with the third signal terminal of the switch means being connectable to the first end of the third signal line or to the input terminal of the amplification means, for directing the incoming signal to the third signal line or to the amplification means, according as a first control signal received at the first control input terminal has a predetermined value or has some other value, and with the fourth signal terminal of the switch means being connectable to the second end of the third signal line or to the output terminal of the amplification means, for directing along the second signal line a signal received from the third signal line or from the amplification means, according as the first control signal received at the first control input terminal has the predetermined value or has some other value;

where the second control input terminal of the switch means receives a second control signal that serves as an override control signal so that, if the second control signal has the predetermined value, the third signal terminal and fourth signal terminal of the switch means are both connected to the third signal line, irrespective of the value of the first control signal.

3. The apparatus of claim 2, wherein said switch means includes an AND gate, having two input terminals and an output terminal, that receives said first and said second control input signals at the two input terminals thereof, that issues the logical product of said first and said second control signals at an output terminal.

4. The apparatus of claim 2, wherein said switch means includes an OR gate, having two input terminals and an output terminal, that receives said first and said second control input signals at the two input terminals thereof, that issues the logical sum of said first and said second control signals at an output terminal.

5. The apparatus of claim 2, wherein said third signal line includes second amplification means, having an input terminal and an output terminal connected, respectively, to said first end and said second end of said third signal line, for receiving an input signal at its input terminal and for producing and issuing at its output terminal an output signal that is approximately equal to the input signal multiplied by a second selected gain coefficient that differs from said first selected gain coefficient.

* * * * *